(12) United States Patent
Chen et al.

(10) Patent No.: US 10,726,902 B2
(45) Date of Patent: Jul. 28, 2020

(54) CIRCUIT FOR CONTROLLING MEMORY AND ASSOCIATED METHOD

(71) Applicant: MStar Semiconductor, Inc., Hsinchu Hsien (TW)

(72) Inventors: Chung-Ching Chen, Hsinchu Hsien (TW); Chen-Nan Lin, Hsinchu Hsien (TW); Che-Wei Chuang, Hsinchu Hsien (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/056,802

(22) Filed: Aug. 7, 2018

(65) Prior Publication Data
US 2019/0214075 A1    Jul. 11, 2019

(30) Foreign Application Priority Data
Jan. 5, 2018  (TW) .............................. 107100498 A (51) Int. Cl.
| G11C 11/406 | (2006.01) |
| G06F 3/06 | (2006.01) |
| G06F 13/16 | (2006.01) |

(52) U.S. Cl.
CPC ...... *G11C 11/40615* (2013.01); *G06F 3/0604* (2013.01); *G06F 3/064* (2013.01); *G06F 3/0659* (2013.01); *G06F 3/0673* (2013.01); *G06F 13/1689* (2013.01); *G11C 2207/22* (2013.01)

(58) Field of Classification Search
CPC ............. G06F 1/04–12; G06F 13/1689; G06F 13/4243; G06F 2205/061; G11C 11/40615; G11C 11/406–40626; G11C 2207/22–229
See application file for complete search history.

(56) References Cited

U.S. PATENT DOCUMENTS

| 6,496,888 B1* | 12/2002 | Pole, II ..................... G06F 1/32 710/110 |
| 7,430,676 B2 | 9/2008 | Baker et al. |
| 2005/0146968 A1* | 7/2005 | Shinozaki ............. G11C 11/406 365/222 |
| 2012/0166861 A1* | 6/2012 | Lu ............................ G06F 1/08 713/501 |
| 2017/0285682 A1* | 10/2017 | Huang ................ G06F 13/1689 |

* cited by examiner

*Primary Examiner* — Nicholas J Simonetti
(74) *Attorney, Agent, or Firm* — McClure, Qualey & Rodack, LLP (57) ABSTRACT

A circuit for controlling a memory includes a frequency parameter generator, a clock generator and a memory controller. The frequency parameter generator generates at least one frequency control signal. The clock generator, coupled to the frequency generator, increases or decreases the frequency of a clock signal by a multiple number of times according to the frequency control signal, such that the frequency of the clock signal is adjusted from an initial frequency to a target frequency. The memory controller, coupled to the clock generator, receives the clock signal and controls the memory according to the clock signal.

20 Claims, 9 Drawing Sheets

CIRCUIT FOR CONTROLLING MEMORY AND ASSOCIATED METHOD

This application claims the benefit of Taiwan application Serial No. 107100498, filed Jan. 5, 2018, the subject matter of which is incorporated herein by reference.

BACKGROUND OF THE INVENTION

Field of the Invention

The present invention relates to a memory, and more particularly to a circuit for controlling a dynamic random access memory (DRAM) and an associated method.

Description of the Related Art

In a common dynamic random access memory (DRAM) system, a memory controller performs down-frequency when a high bandwidth is not required for a memory, so as to achieve the effectiveness of power saving. However, in the prior art, a DRAM can change the frequency only in a self-refresh mode. Thus, if a memory controller is to control a DRAM for up-frequency or down-frequency, an additional period (in a scale of ms) for entering/exiting the self-refresh mode needs to be sacrificed. If a memory demands a fast changes in the bandwidth, a memory controller then frequently controls the memory to enter/exit the self-refresh mode, causing long periods of time delay.

SUMMARY OF THE INVENTION

Therefore, it is a primary object of the present invention to provide a circuit for controlling a memory and an associated method capable of significantly reducing the number of times of entering a self-refresh mode for the memory, so as to solve issues of the prior art.

A circuit for controlling a memory is disclosed according to an embodiment of the present invention. The circuit includes a frequency parameter generator, a clock generator and a memory controller. The frequency parameter generator generates at least one frequency control signal. The clock generator, coupled to the frequency parameter generator, increases or decreases the frequency of a clock signal by a multiple number of times according to the frequency control signal to adjust the frequency of the clock signal from an initial frequency to a target frequency. The memory controller, coupled to the clock generator, receives the clock signal, and controls the memory according to the clock signal.

A method for controlling a method is further disclosed according to another embodiment of the present invention. The method includes: generating at least one frequency control signal by a frequency parameter generator; increasing or decreasing the frequency of a clock signal by a multiple number of times according to the frequency control signal to adjust the frequency of the clock signal from an initial frequency to a target frequency; and controlling the memory according to the clock signal.

A circuit for controlling a memory is disclosed according to another embodiment of the present invention, wherein the memory is a dynamic random access memory (DRAM). The circuit includes a memory controller and an adjustment frequency determining circuit. The memory controller controls access of the memory. The adjustment frequency determining circuit automatically detects an access requirement of the memory to trigger the memory controller to control the memory to enter or exit a self-refresh mode.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
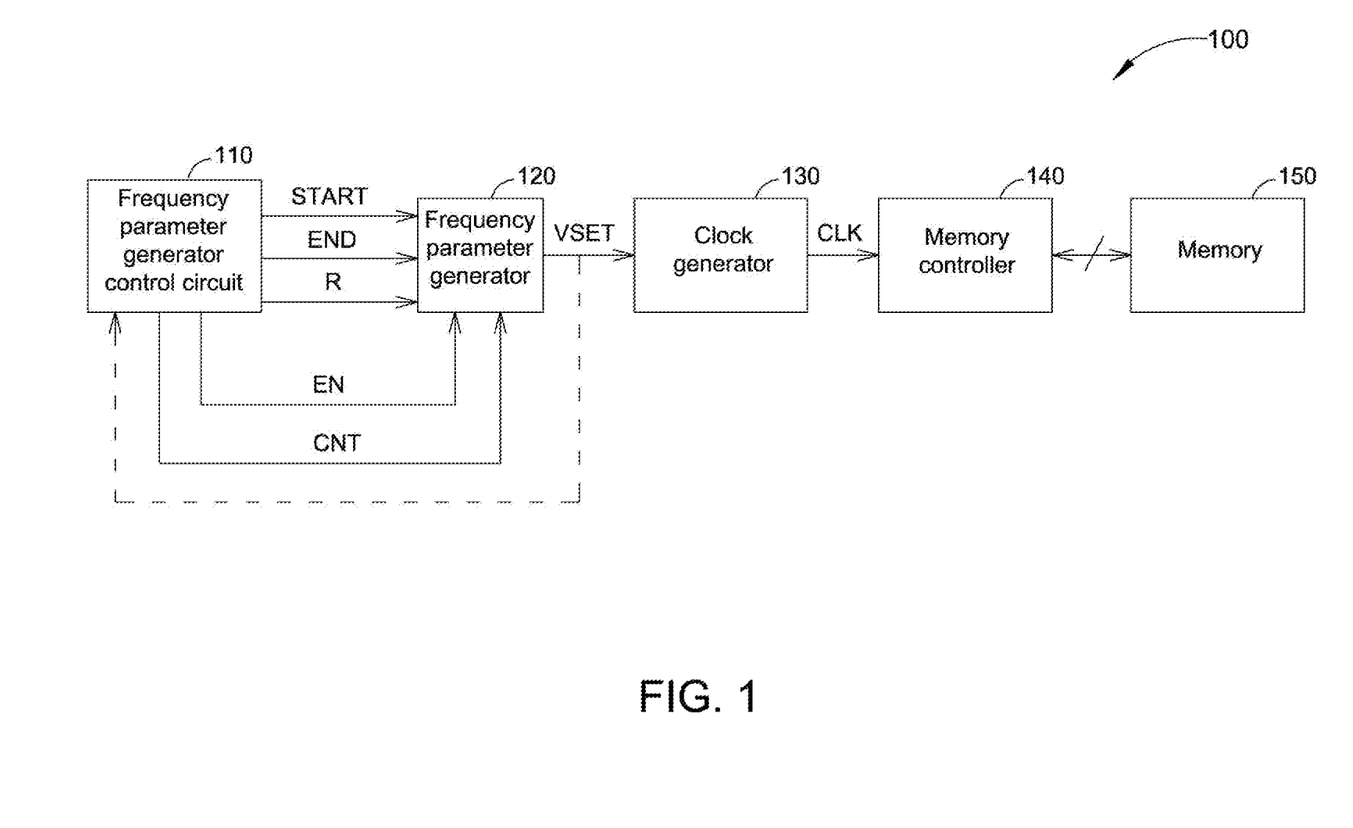
FIG. 1 is a block diagram of a circuit according to an embodiment of the present invention.

FIG. 1 shows a block diagram of a circuit 100 according to an embodiment of the present invention. As shown in FIG. 1, the circuit 100 includes a frequency parameter generator control circuit 110, a frequency parameter generator 120, a clock generator 130, a memory controller 140 and a memory 150. In this embodiment, the memory controller 140 is a dynamic random access memory (DRAM) controller, and the memory 150 is a DRAM.

In the operation of the circuit 100, when the frequency of the memory 150 needs to be adjusted, the frequency parameter generator control circuit 110 first generates an initial frequency parameter START, a target frequency parameter END and a frequency adjustment speed parameter R to the frequency parameter generator 120. The initial frequency parameter START represents an initial frequency of a clock signal CLK (or a current frequency of the clock signal CLK) generated by the clock generator 130, the target frequency parameter END represents a target frequency of the clock signal CLK, and the frequency adjustment speed parameter R represents a speed for adjusting the clock signal CLK during frequency adjustment. The frequency parameter generator control circuit 110 uses an enable signal EN to enable the frequency parameter generator 120. Further, the frequency parameter generator control circuit 110 generates a sampling interval parameter CNT to control the frequency parameter generator 120 to output, according to a sampling interval, a frequency control signal VSET for the clock generator 130 to accordingly adjust the frequency of the clock signal CLK.

For example, assuming that the frequency of the memory 150 needs to be decreased from 3200 MHz to 1600 MHz, the frequency parameter generator control circuit 110 first generates the initial frequency parameter START for representing 3200 MHz, the target frequency parameter END for representing 1600 MHz, and the frequency adjustment speed parameter R to the frequency parameter generator 120. According to the same sampling interval parameter CNT, if the setting of the frequency adjustment speed parameter R is a slower frequency adjustment speed, after receiving the enable signal EN, the frequency parameter generator 120 can sequentially output the frequency control signals VSET representing 3100 MHz, 3000 MHz, 2900 MHz, . . . and 1600 MHz according to the sampling interval parameter CNT to control the clock generator 130 to slowly change the frequency of the clock signal CLK. If the setting of the frequency adjustment speed parameter R is a faster frequency adjustment speed, after receiving the enable signal EN, the frequency parameter generator 120 can directly output the frequency control signal VSET representing 1600 MHz to the clock generator 130 so as to quickly change the frequency of the clock signal CLK. In practice, the frequency adjustment speed parameter R may be set according to requirements and is not a constant value.

The memory controller 140 receives the clock signal CLK from the clock generator 130, and uses the clock signal CLK to access the memory 150.

In one embodiment of the present invention, the frequency adjustment speed parameter R generated by the frequency parameter generator control circuit 110 controls the speed at which the frequency of the clock CLK changes to be lower than an upper limit. Further, when the clock generator 130 adjusts the frequency of the clock signal CLK according to the frequency control signal VSET, the memory controller 140 is not required to control the memory 150 to first enter a self-refresh mode but can directly adjust the frequency of the clock signal CLK while the memory 150 remains in the normal operation mode. As such, the issue of the prior art, in which significant time delay is caused by frequently entering/exiting a self-refresh mode, is eliminated.

By having the frequency adjustment speed parameter R control the speed at which the frequency of the clock signal CLK changes to be lower than an upper limit, in addition to eliminating the foregoing issue of frequently entering/exiting a self-refresh mode, glitch caused by drastically increasing or decreasing the frequency at a fast speed in the prior art can also be avoid; moreover, slowing increasing or decreasing the frequency also alleviates the issue of electromagnetic interference (EMI).

Further, in one embodiment, the frequency parameter generator control circuit 110 can receive the clock signal CLK generated by the clock generator 130 or the frequency control signal VSET outputted by the frequency parameter generator 120. If the frequency of the clock signal CLK received is equal to the target frequency or the frequency of the clock signal CLK corresponding to the frequency control signal VSET received is equal to the target frequency, the frequency parameter generator control circuit 110 ceases to generate the enable signal EN to turn off the frequency parameter generator 120.

Figure 2:
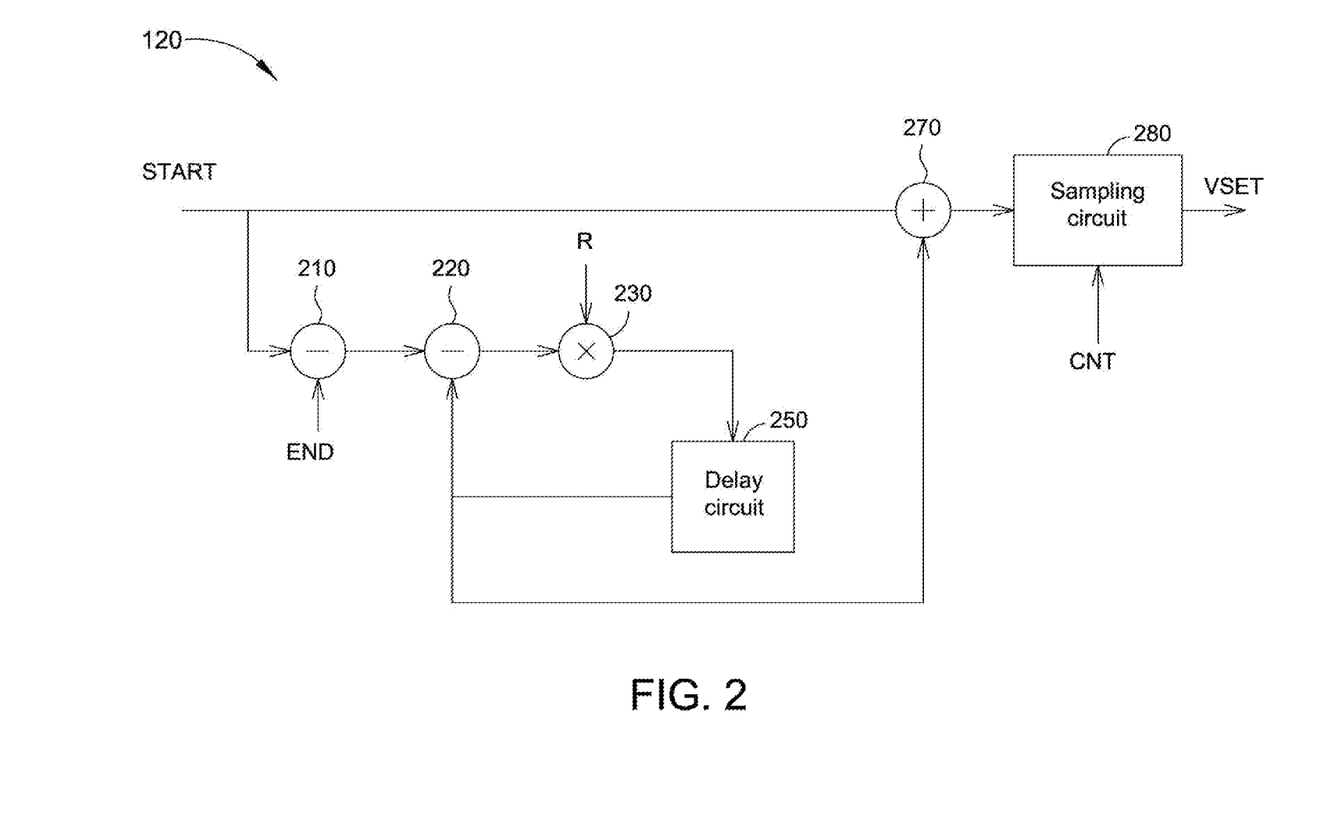
FIG. 2 is a block diagram of a frequency parameter generator according to an embodiment of the present invention.

FIG. 2 shows a block diagram of the frequency parameter generator 120 according to an embodiment of the present invention. As shown in FIG. 2, the frequency parameter generator 120 includes a subtractor 210, a subtractor 220, an adder 270, a multiplier 230, a delay circuit 250 and a sampling circuit 280. In the operation of the frequency parameter generator 120, the subtractor 210 first performs subtraction on the initial frequency parameter START and the target frequency parameter END to generate a difference signal. The subtractor 220, the multiplier 230 and the delay circuit 250 form a loop. The subtractor 220 first performs subtraction on the difference signal and the output of the delay circuit 250, multiplication is then performed on a difference of the difference signal and the output of the delay circuit 250 and the frequency adjustment speed parameter R to obtain an adjustment value, and subtraction is performed on the adjustment value having been delayed by the delay circuit 250 with the subsequent difference signal. Meanwhile, the adder 270 adds the adjustment value to the initial frequency parameter START to generate a frequency control signal to be sampled, and the sampling circuit 280 then samples the frequency control signal to be sampled according to the sampling interval parameter CNT to generate the frequency control signal VSET and transmits the same to the clock generator 130.

It should be noted that, the circuit structure in FIG. 2 is an illustrative example and is not to be construed as a limitation to the present invention. Given that the frequency parameter generator 120 can control the speed at which the frequency represented by the frequency control signal VSET is increased or decreased according to the frequency adjustment speed parameter R, any related design modifications are to be encompassed within the scope of the present invention.

Figure 3:
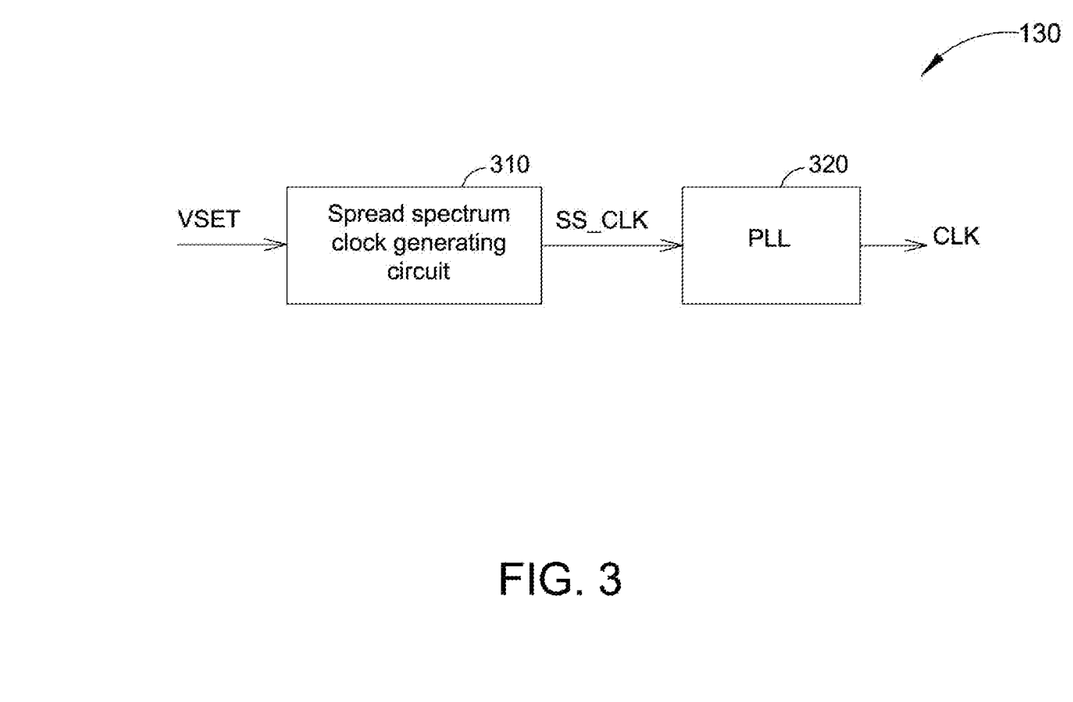
FIG. 3 is a block diagram of a clock generator according to an embodiment of the present invention.

FIG. 3 shows a block diagram of the clock generator 130 according to an embodiment of the present invention. As shown in FIG. 3, the clock generator 130 includes a spread spectrum clock generating circuit 310 and a phase-locked loop (PLL) 320. The spread spectrum clock generating circuit 310 receives the frequency control signal VSET and accordingly generates a spread spectrum clock signal SS_CLK. For example, the spread spectrum clock generating circuit 310 may change the frequency of a signal by a periodical modulation signal (e.g., a triangle-wave signal) to disperse the energy originally focused at a frequency to achieve the function of frequency modulation. The PLL 320 then generates the clock signal CLK according to the spread spectrum clock signal SS_CLK to the memory controller 140.

Figure 4:
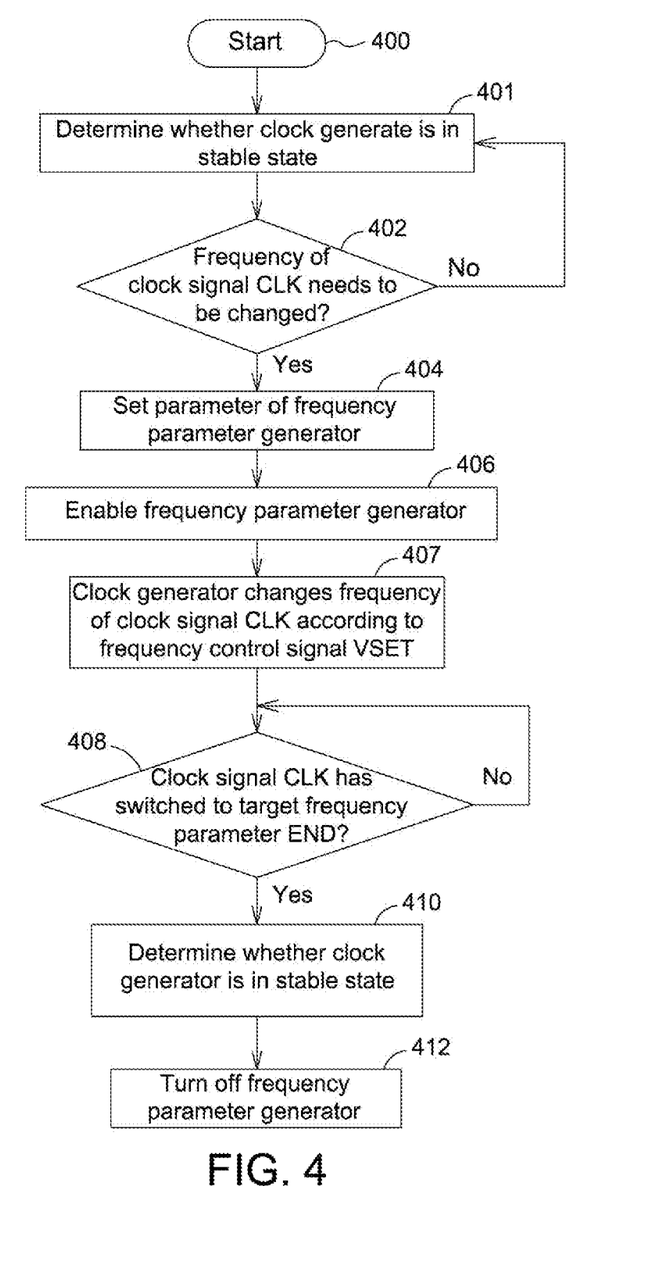
FIG. 4 is a flowchart of a method for controlling a memory according to an embodiment of the present invention.

FIG. 4 shows a flowchart of a method for controlling the memory 150 according to an embodiment of the present invention. Referring to the disclosure of the embodiment in FIGS. 1 to 3, the process of FIG. 4 is as follows.

In step 400, the process begins.

In step 401, it is determined whether the clock generator 130 is in a stable state. More specifically, step 401 determines whether the output of the PLL 320 in the clock generator 130 is in a stable state, i.e., whether the clock generator 130 is capable of generating the clock signal CLK having a stable initial frequency to the memory controller 140.

In step 420, it is determined whether the frequency of the clock signal CLK needs to be changed. If so, the process enters step 404; if not, the process returns to step 401.

In step 404, the parameter of the frequency parameter generator 120 is set. The frequency parameter generator control circuit 110 transmits the initial frequency parameter START, the target frequency parameter END and the frequency adjustment speed parameter R to the frequency parameter generator 120 for the frequency parameter generator 120 to perform further settings.

In step 406, the frequency parameter generator 120 is enabled. The frequency parameter generator control circuit 110 uses the enable signal EN to enable the frequency parameter generator 120, so as to start generating the frequency control signal VSET to the clock generator 130.

In step 407, the clock generator 130 changes the frequency of the clock signal CLK according to the frequency control signal VSET. More specifically, the clock generator 130 gradually controls the clock signal CLK having the initial frequency to change to the clock signal CLK having the target frequency according to the frequency control signal VSET, wherein the target frequency is determined by the target frequency parameter END.

In step 408, it is determined whether the clock signal CLK is switched to the target frequency parameter END. If so, the processor enters step 410; if not, the process returns to step 408. It should be noted that, step 408 may also be determined through the frequency control signal VSET.

In step 410, it is determined whether the clock generator 130 is in a stable state. More specifically, step 410 determines whether the output of the PLL 320 in the clock generator 130 is in a stable state; that is, whether the clock generator 130 is capable of generating the clock signal CLK having the stable target frequency to the memory controller 140.

In step 412, the frequency parameter generator 120 is turned off. The frequency parameter generator control circuit 110 ceases to transmit the enable signal EN to turn of the frequency parameter generator 120. It should be noted that, although the frequency parameter generator 120 is turned off, the clock generator 130 nonetheless continues to output the clock signal CLK according to the final adjustment result.

Figure 5:
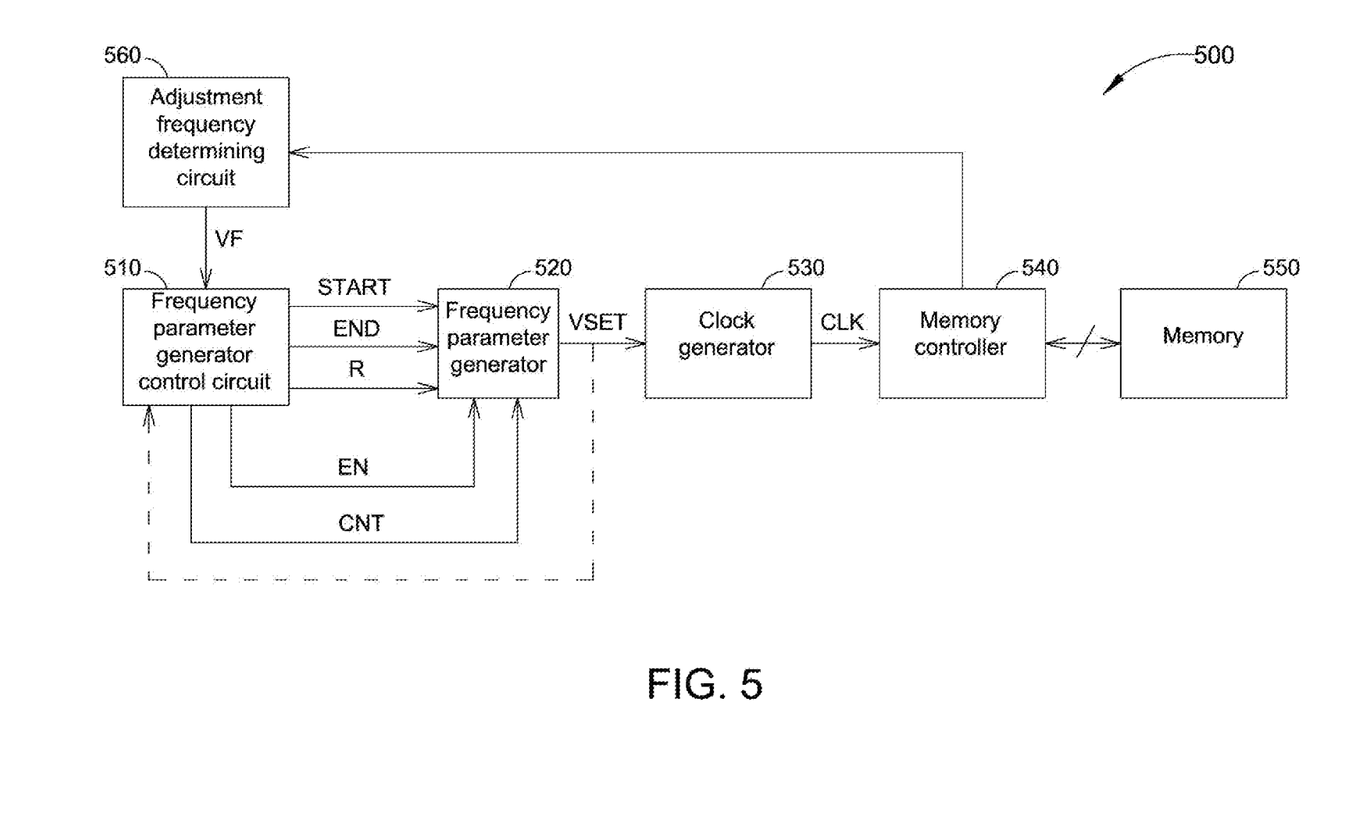
FIG. 5 is a block diagram of a circuit according to another embodiment of the present invention.

FIG. 5 shows a block diagram of a circuit 500 according to an embodiment of the present invention. Compared to the circuit 100 in FIG. 1, the circuit 500 further includes an adjustment frequency determining circuit 560, and thus the description below focuses on details of the adjustment frequency determining circuit 560. In the operation of the circuit 500, the adjustment frequency determining circuit 560 automatically detects an access requirement of a memory 550 so as to determine whether to perform frequency adjustment on the clock signal CLK. That is to say, the adjustment frequency determining circuit 560 performs step 402 in FIG. 4. More specifically, the adjustment frequency determining circuit 560 can generate a frequency adjustment signal VF according to whether a memory controller 540 receives an access request from at least one function block, or according to the bandwidth that the memory controller 540 currently needs to use, to perform frequency adjustment. Assuming that the memory controller 540 currently has not received any access request from any function block or the bandwidth needed to be used in the memory controller 540 is lower than a threshold, it means that the frequency can be decreased to perform a more power saving operation. At this point, the adjustment frequency determining circuit 560 transmits the adjustment signal VF to the frequency parameter generator control circuit 510 to control a frequency parameter generator 520 to generate the frequency control signal VSET to a clock generator 530, so as to decrease the frequency of the clock signal CLK. Assuming that the memory controller 540 later receives an access request from a function block, or the bandwidth needed to be used in the memory controller 540 is higher than the threshold, the adjustment frequency determining circuit 560 transmits the frequency adjustment signal VF to the frequency parameter generator control circuit 510 to control the frequency parameter generator 520 to generate the frequency control signal VSET to the clock generator 530, so as to increase the frequency of the clock signal CLK to the target frequency. Operation details for increasing or decreasing the frequency can be referred to the above description associated with steps 404 to 412, and are omitted herein.

In the embodiment in FIG. 5, because the adjustment frequency determining circuit 560 is capable of automatically detecting related information of the memory 550 accessed by the memory controller 540 to determine whether to adjust the frequency, operations can be effectively performed while achieving the effectiveness of power saving. Further, by gradually increasing or decreasing the frequency through the frequency parameter generator control circuit 510 and the frequency parameter generator 520, impulsive interference caused by drastically increasing or decreasing the frequency at a fast speed as in the prior art can be avoided, thus allowing the system to be more stable.

Figure 6:
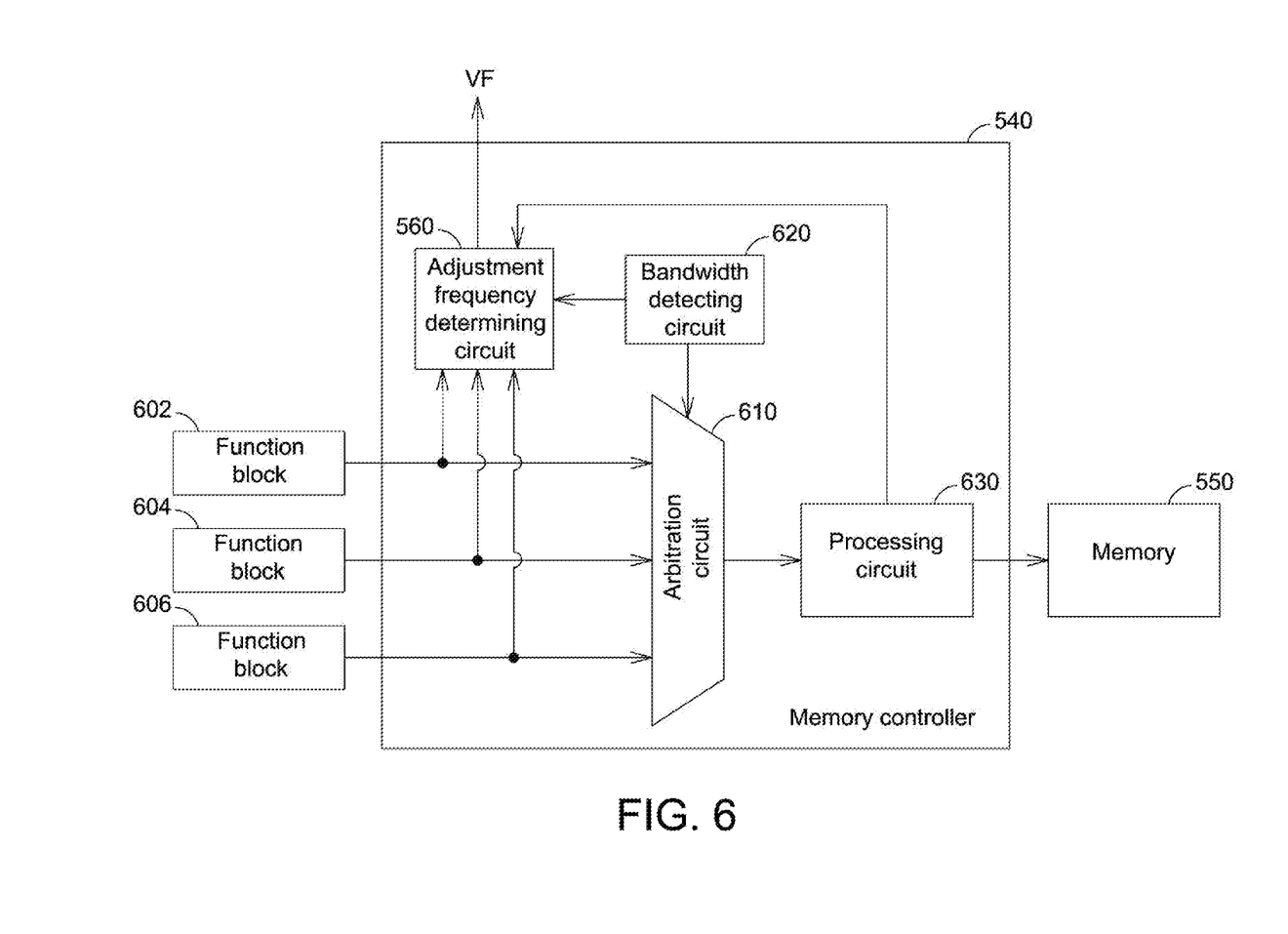
FIG. 6 is a block diagram of a memory controller according to an embodiment of the present invention.

In one embodiment, the adjustment frequency determining circuit 560 may be provided in the memory controller 540. FIG. 6 shows a block diagram of the memory controller 540 according to an embodiment of the present invention. As shown in FIG. 6, the memory controller 540 includes the adjustment frequency determining circuit 560, an arbitration circuit 610, a bandwidth detecting circuit 620 and a processing circuit 630. The arbitration circuit 610 receives access requests from multiple function blocks 602, 604 and 606, and determines processing sequences thereof. The bandwidth detecting circuit 620 is capable of real-time detecting the bandwidth in the arbitration circuit 610 (i.e., the amount of data flow of the arbitration circuit 610, and the amount of data flow gets increases as the number of access requests received by the arbitration circuit 610 gets larger), and the adjustment frequency determining circuit 560 real-time generates the frequency adjustment signal VF according to a detection result of the bandwidth detecting circuit 620. Further/Alternatively, the bandwidth detecting circuit 620 may determine whether the function blocks 602, 604 and 606 transmit access requests to the arbitration circuit 610. If no access request transmitted from any of the function blocks is detected, the frequency adjustment determining circuit 560 generates the frequency adjustment signal VF to decrease the frequency of the clock signal CLK; if an access request transmitted from any one of the function blocks is detected, the adjustment frequency determining circuit 560 generates the frequency adjustment signal VF to increase the frequency of the clock signal CLK.

Figure 7:
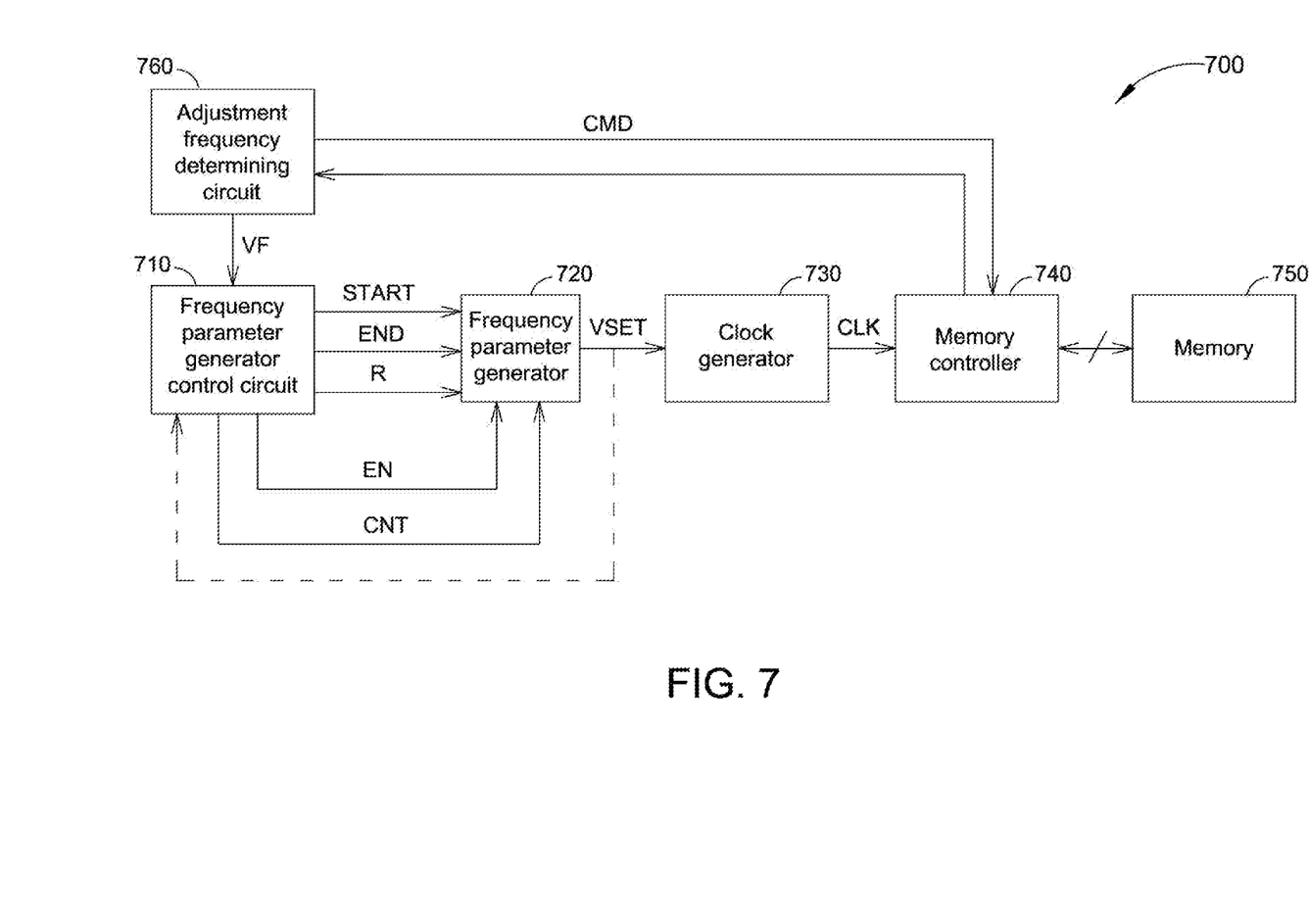
FIG. 7 is a block diagram of a circuit according to another embodiment of the present invention.

FIG. 7 shows a block diagram of a circuit 700 according to another embodiment of the present invention. The function of the circuit 700 is similar to that of the circuit 500 in FIG. 5, with one difference being that an adjustment frequency determining circuit 760 additionally controls, according to an access requirement of a memory 750, an internal processing circuit of a memory controller 740 to enter/exit a self-refresh mode. The process of entering/exiting the self-refresh mode includes three phases, which are a down-frequency phase, an idle phase and an up-frequency phase. More specifically, assuming that the current memory controller 740 does not receive any access request from any function block or the bandwidth needed to be used in the memory controller 740 is lower than a threshold, the adjustment frequency determining circuit 760 transmits a control signal CMD to the memory controller 740 to cause the internal circuit of the memory controller 740 to enter the self-refresh mode. Next, the adjustment frequency determining circuit 760 transmits a frequency adjustment signal VF to a frequency parameter generator control circuit 710 to control a frequency parameter generator 720 to generate the frequency control signal VSET to a clock generator 730, so as to gradually decrease the frequency of the clock signal CLK. Operation details for decreasing the frequency can be referred from the description on steps 404 to 412 above. The memory controller 740 later enters the idle phase. Next, when the current memory controller 740 receives an access request from a function block or the bandwidth needed to be used in the memory controller 740 is higher than the threshold, the adjustment frequency determining circuit 760 again transmits the frequency adjustment signal VF to the frequency parameter generator control circuit 710 to control the frequency parameter generator circuit 720 to generate the frequency control signal VSET to the clock generator 730, so as to gradually increase the frequency of the clock signal CLK. The adjustment frequency determining circuit 760 later again transmits the control signal CMD to the memory controller 740 to cause the internal circuit of the memory controller 740 to exit the self-refresh mode.

In the embodiment in FIG. 7, because the adjustment frequency determining circuit 760 is capable of automatically detecting related information for accessing the memory 750 to determine whether to enter/exit the self-refresh mode and then again enter a down-frequency/up-frequency operation, operations can be more effectively performed while achieving the effectiveness of power saving (an optimal power saving effect can be achieved during the idle phase after entering the self-refresh mode). Further, since technical content of controlling the speed for up-frequency/down-frequency described in the foregoing embodiments are adopted, the issues of impulsive interference and EMI can be avoid at the same time.

Figure 8:
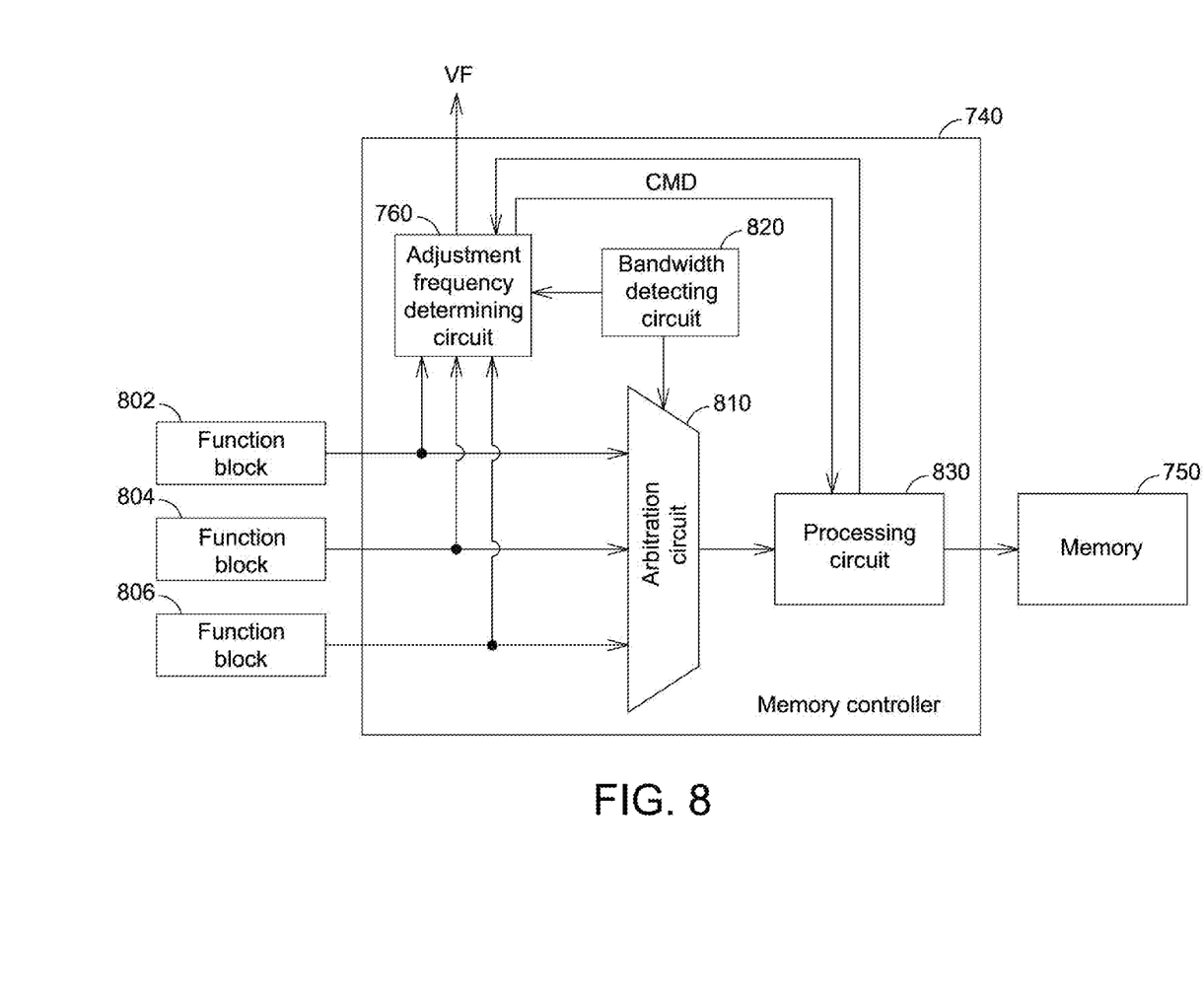
FIG. 8 is a block diagram of a memory controller according to another embodiment of the present invention.

In one embodiment, the adjustment frequency determining circuit 760 may be provided in the memory controller 740. FIG. 8 shows a block diagram of the memory controller 740 according to another embodiment of the present invention. The memory controller 740 shown in FIG. 8 is similar to the memory controller 540 in FIG. 6, with one difference being that the adjustment frequency determining circuit 760 additionally generates the control signal CMD to a processing circuit 830 so as to control the memory controller 740 to enter/exit the self-refresh mode. A person skilled in the art could easily understand operation details of the memory controller 740 in FIG. 8 on the basis of the description of the embodiments in FIG. 4 to FIG. 7, and such repeated details are omitted herein.

Figure 9:
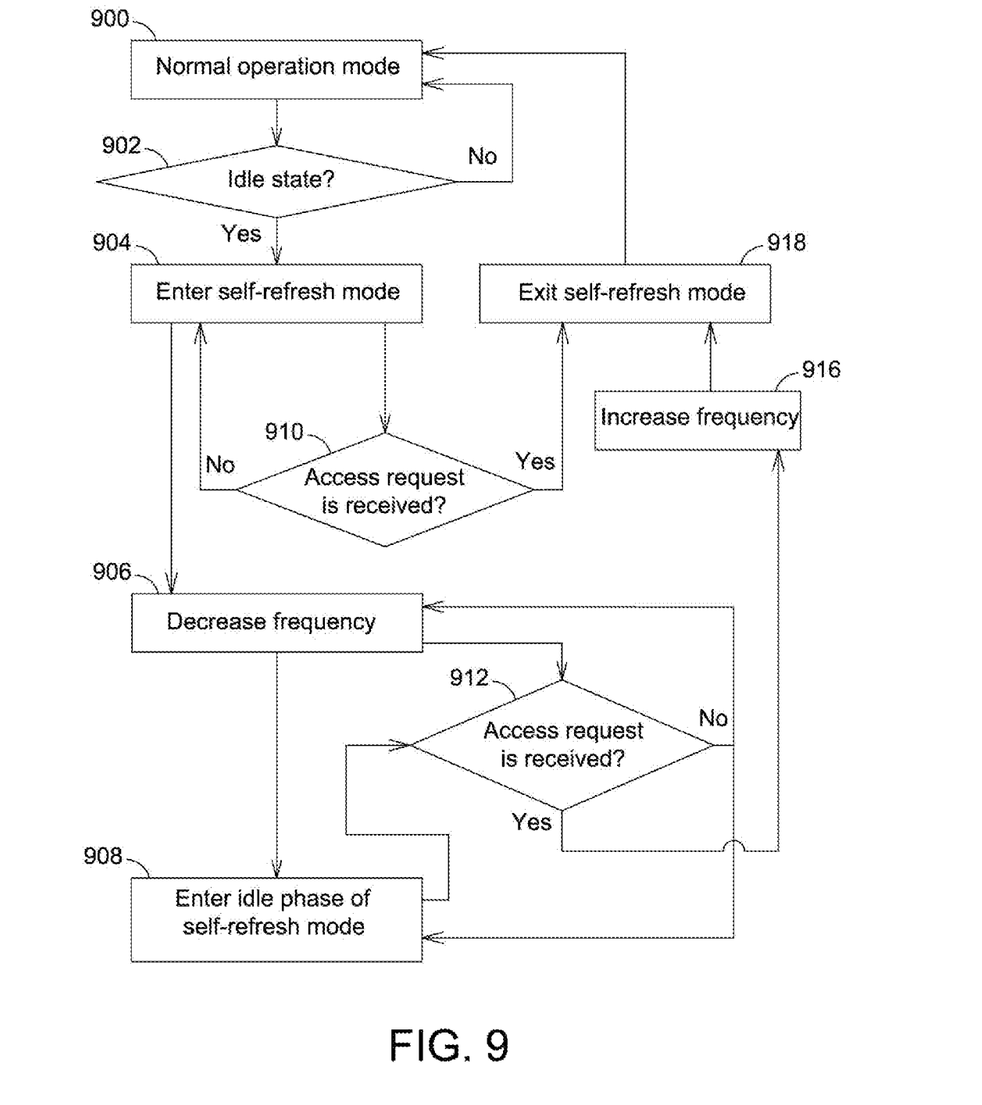
FIG. 9 is a flowchart of a method for controlling a memory according to another embodiment of the present invention.

FIG. 9 shows a flowchart of a method for controlling the memory 750 according to an embodiment of the present invention. Referring to the disclosure of embodiments in FIGS. 7 and 8, the process of FIG. 9 includes following steps.

In step 900, the memory controller 740 operates in a normal mode.

In step 902, it is determine whether the memory controller 740 is in an idle state, e.g., the adjustment frequency determining circuit 760 determines whether the memory controller 740 has not received access requests from function blocks 802, 804 and 806 for a period of time.

In step 904, the adjustment frequency determining circuit 760 controls, by the control signal CMD, the memory controller 740 to enter a self-refresh mode.

In step 906, the adjustment frequency determining circuit 760 transmits the frequency adjustment signal VF to the frequency parameter generator control circuit 710 to control the frequency parameter generator 720 to generate the frequency control signal VSET to the clock generator 730, so as to decrease the frequency of the clock signal CLK. When the frequency of the clock signal CLK is low enough, the process enters step 908.

In step 908, the memory controller 740 enters the idle phase of the self-refresh mode.

In step 910, while step 904 is performed, it is determined whether the memory controller 740 receives the access requests from the function blocks 802, 804 and 806. If so, the process enters step 918; if not, the process continues to step 904.

In step 912, while steps 906 and 908 are performed, it is determined whether the memory controller 740 receives the access requests from the function blocks 802, 804 and 806. If so, the process enters step 916; if not, the process returns to step 908.

In step 916, adjustment frequency determining circuit 760 transmits the frequency adjustment signal VF to the frequency parameter generator control circuit 710 to control the frequency parameter generator 720 to generate the frequency control signal VSET to the clock generator 730, so as to increase the frequency of the clock signal CLK.

In step 918, the adjustment frequency determining circuit 760 controls, by the control signal CMD, the memory controller 740 to exit the self-refresh mode.

In conclusion of the present invention, in the embodiments of the present invention, a frequency parameter generator is provided to gradually adjust the frequency at a slower speed, such that a memory controller is still able to perform the operation of up-frequency or down-frequency without entering a self-refresh mode. By providing an adjustment frequency determining circuit to dynamically detect an access requirement to further determine whether to enter or exit a self-refresh mode, operations can be more efficiently performed while achieving the effectiveness of power saving. Further, while entering or exiting a self-refresh mode, a slower speed is used to gradually adjust the frequency, thus further avoiding the issue of impulsive interference and EMI caused by drastically increasing or decreasing the frequency at once, allowing the system to be more stable.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit for controlling a memory, comprising:
    a frequency parameter generator, generating a frequency control signal;
    a clock generator, coupled to the frequency parameter generator, increasing or decreasing a frequency of a clock signal for a multiple number of times according to the frequency control signal, such that the frequency of the clock signal is adjusted from an initial frequency to a target frequency; and
    a memory controller, coupled to the clock generator, receiving the clock signal, and controlling the memory according to the clock signal, wherein the memory controller comprises a self-refresh mode;
    wherein the memory controller does not enter the self-refresh mode while the clock generator adjusts the frequency of the clock signal from the initial frequency to the target frequency.

2. The circuit according to claim 1, wherein the frequency parameter generator receives an initial frequency parameter, a target frequency parameter and a frequency adjustment speed parameter to generate the frequency control signal.

3. The circuit according to claim 2, wherein the frequency parameter generator adjusts the frequency control signal for a multiple number of times according to the initial frequency parameter, the target frequency parameter and the frequency adjustment speed parameter, such that the clock generator increases or decreases the frequency of the clock signal for a multiple number of times.

4. The circuit according to claim 1, wherein the memory is a random access memory (DRAM), the memory controller is a DRAM controller.

5. The circuit according to claim 1, further comprising:
a frequency parameter generator control circuit, transmitting an initial frequency parameter, a target frequency parameter, a frequency adjustment speed parameter and an enable signal to the frequency parameter generator;
wherein, when the frequency of the clock signal needs to be adjusted, the frequency parameter generator control circuit first transmits the initial frequency parameter, the target frequency parameter and the frequency adjustment speed parameter to the frequency parameter generator, and then transmits the enable signal to enable an operation of the frequency parameter generator.

6. The circuit according to claim 1, wherein the memory is a dynamic random access memory (DRAM) and the memory controller is a DRAM controller, the circuit further comprising:
an adjustment frequency determining circuit, detecting an access requirement of the memory, and controlling the memory to enter or exit the self-refresh mode according to detection result.

7. The circuit according to claim 6, wherein the access requirement is associated with an access request of a function block for accessing the memory.

8. The circuit according to claim 6, further comprising:
an arbitration circuit, coupled to a plurality of function blocks, receiving access requests from the plurality of function blocks and determining a processing sequence of the access requests, wherein the arbitration circuit uses a larger bandwidth as the number of access requests received by the arbitration circuit increases, and the access requests are associated with the bandwidth used by the arbitration circuit.

9. A method for controlling a memory, comprising:
utilizing a frequency parameter generator to generate at least one frequency control signal;
increasing or decreasing a frequency of a clock signal for a multiple number of times according to the frequency control signal, such that the frequency of the clock signal is adjusted from an initial frequency to a target frequency; and
controlling the memory according to the clock signal;
the step of controlling the memory is performed by a memory controller, wherein the memory controller comprises a self-refresh mode, the method further comprising:
the memory controller not entering the self-refresh mode while the frequency of the clock signal is adjusted from the initial frequency to the target frequency according to the frequency control signal.

10. The method according to claim 9, wherein the step of generating the at least one frequency control signal comprises:
utilizing the frequency parameter generator to receive an initial frequency parameter, a target frequency parameter and a frequency adjustment speed parameter to generate the frequency control signal.

11. The method according to claim 10, wherein the step of generating the frequency control signal and adjusting the frequency of the clock signal according to the frequency control signal comprises:
utilizing the frequency parameter generator to update the frequency control signal for a multiple number of times according to the initial frequency parameter, the target frequency parameter and the frequency adjustment speed parameter; and
increasing or decreasing the frequency of the clock signal for a multiple number of times according to the frequency control signal having been updated for a multiple number of times, such that the frequency of the clock signal is adjusted from the initial frequency to the target frequency.

12. The method according to claim 9, wherein the memory is a dynamic random access memory (DRAM).

13. The method according to claim 9, further comprising:
transmitting an enable signal to the frequency parameter generator;
wherein, when the frequency of the clock signal needs to be adjusted, first transmitting an initial frequency parameter, a target frequency parameter and a frequency adjustment speed parameter to the frequency parameter generator, and then transmitting an enable signal to enable the frequency parameter generator.

14. The method according to claim 9, wherein the memory is a dynamic random access memory and the step of controlling the memory according to the clock signal is performed by a memory controller, the method further comprising:
automatically detecting an access requirement of the memory, and controlling, according to a detection result, the memory controller to enter or exit the self-refresh mode.

15. The method according to claim 14, wherein the access requirement is associated with an access request of a function block for accessing the memory.

16. The method according to claim 14, wherein the circuit comprises an arbitration circuit for receiving access requests from a plurality of function blocks and determining a processing sequence of the access requests, and the arbitration circuit uses a larger bandwidth as the number of access requests received by the arbitration circuit increases, and the access requests are associated with the bandwidth used by the arbitration circuit.

17. A circuit for controlling a memory, the memory being a dynamic random access memory (DRAM), the circuit comprising:
a memory controller, controlling access of the memory; and
an adjustment frequency determining circuit, detecting an access requirement of the memory, so as to trigger the memory controller to enter or exit a self-refresh mode;
wherein the memory controller does not enter the self-refresh mode while the clock generator adjusts the frequency of the clock signal from the initial frequency to the target frequency.

18. The circuit according to 17, wherein the adjustment frequency determining circuit detects whether the memory controller receives an access request from at least one function block, or detects a bandwidth of an arbitration circuit coupled between the at least one function block and the memory controller, so as to trigger the memory controller to enter or exit the self-refresh mode.

19. The circuit according to 18, wherein when the adjustment frequency determining circuit detects that the memory controller has not received the access request from the at least one function block, the adjustment frequency determining circuit triggers the memory controller to enter the self-refresh mode; when the adjustment frequency determining circuit detects that the memory controller has received the access request from the at least one function block, the adjustment frequency determining circuit triggers the memory controller to exit the self-refresh mode.

20. The circuit according to 18, wherein when the adjustment frequency determining circuit detects that the bandwidth currently used by the arbitration circuit is greater than a threshold, the adjustment frequency determining circuit triggers the memory controller to enter the self-refresh mode; when the adjustment frequency determining circuit detects that the bandwidth used by the arbitration circuit is not greater than the threshold, the adjustment frequency determining circuit triggers the memory controller to exit the self-refresh mode.

* * * * *